US008677221B2

(12) United States Patent
Cornwell et al.

(10) Patent No.: US 8,677,221 B2
(45) Date of Patent: Mar. 18, 2014

(54) PARTIAL VOLTAGE READ OF MEMORY

(75) Inventors: Michael J. Cornwell, San Jose, CA (US); Christopher P. Dudte, San Jose, CA (US)

(73) Assignee: Apple Inc., Cupertino, CA (US)

( * ) Notice: Subject to any disclaimer, the term of this patent is extended or adjusted under 35 U.S.C. 154(b) by 1092 days.

(21) Appl. No.: 12/205,687

(22) Filed: Sep. 5, 2008

(65) Prior Publication Data
US 2009/0172481 A1    Jul. 2, 2009

Related U.S. Application Data

(60) Provisional application No. 61/018,651, filed on Jan. 2, 2008.

(51) Int. Cl.
  *G06F 11/00* (2006.01)
(52) U.S. Cl.
  USPC .......................................... 714/781
(58) Field of Classification Search
  USPC ................................ 714/781, 721
  See application file for complete search history.

(56) References Cited

U.S. PATENT DOCUMENTS

| | | | | |
|---|---|---|---|---|
| 4,692,894 A * | 9/1987 | Bemis | | 710/57 |
| 4,862,459 A * | 8/1989 | Fukushima | | 714/721 |
| 5,768,494 A * | 6/1998 | Takeishi | | 714/17 |
| 6,163,481 A * | 12/2000 | Yamada et al. | | 365/185.11 |
| 7,213,195 B2 * | 5/2007 | Sawaguchi et al. | | 714/794 |
| 7,805,663 B2 * | 9/2010 | Brandman et al. | | 714/794 |
| 7,904,788 B2 * | 3/2011 | Brandman et al. | | 714/760 |
| 7,949,927 B2 * | 5/2011 | Park et al. | | 714/762 |
| 2005/0028039 A1 * | 2/2005 | Henderson et al. | | 714/42 |
| 2008/0092015 A1 * | 4/2008 | Brandman et al. | | 714/763 |
| 2008/0104460 A1 * | 5/2008 | Kanaoka | | 714/721 |
| 2009/0113238 A1 * | 4/2009 | Liu et al. | | 714/14 |
| 2013/0024736 A1 * | 1/2013 | Roohparvar et al. | | 714/708 |

OTHER PUBLICATIONS

Dictionary definition from wikipedia for the term: "logic level", retrieved on Jun. 18, 2013 from http://en.wikipedia.org/wiki/Logic_level.*
Dictionary definition from wikipedia for the term: flash memory, retrieved on Jun. 18, 2013, from http://en.wikipedia.org/wiki/Flash_memory.*
Takeuchi, et al., "A 56-nm CMOS 99-mm2 8-Gb Multi-Level NAND Flash Memory with 10-MB/s Program Throughput", 2007, 14 pages.

* cited by examiner

*Primary Examiner* — Yair Leibovich
(74) *Attorney, Agent, or Firm* — Meyertons, Hood, Kivlin, Kowert & Goetzel, P.C.

(57) ABSTRACT

A partial voltage level read is made on memory cells of a solid state memory device during a voltage settling time after the memory cells are charged (e.g., by a pulse from a charge pump). Digital values representing partial voltage levels are checked for errors (e.g., by an error correction code (ECC) engine). If the values can be corrected, then the values are released for host access. If the values cannot be corrected, then a full voltage read is performed on the memory cells after the voltage levels have substantially settled. Digital values corresponding to the full voltage reads can be released for host access. The use of partial voltage reads results in faster read of solid state memory devices.

16 Claims, 4 Drawing Sheets

PARTIAL VOLTAGE READ OF MEMORY

RELATED APPLICATION

The application claims the benefit of priority from U.S. Provisional Patent Application No. 61/018,651, for "Partial Voltage Read of Memory," filed Jan. 2, 2008, which patent application is incorporated by reference herein in its entirety.

TECHNICAL FIELD

The subject matter of this patent application is generally related to solid state memory devices.

BACKGROUND

When storing information in a memory cell of a solid state memory device, a voltage is applied to the memory cell to raise its voltage to a desired level. The voltage can be applied in pulses. Typically, the voltage level spikes up and then ramps down until it settles to a steady state voltage level. After the voltage settles, the voltage is read to determine the voltage level. This process takes time to complete and contributes to a slow memory read.

SUMMARY

Partial voltage reads are made on memory cells of a solid state memory device at a first time prior to a voltage settling time after the memory cells are charged (e.g., by a pulse from a charge pump). Digital values obtained from the partial voltage reads are checked for errors (e.g., by an error correction code (ECC) engine). If the errors can be corrected, then the values are released for host access. If the errors cannot be corrected, then full voltage reads are performed on the memory cells at a second time after the voltages have substantially settled. Digital values obtained from the full voltage reads are released for host access. The use of partial voltage reads provides for faster read out of solid state memory devices.

DETAILED DESCRIPTION

Solid State Memory System Overview

Figure 1A:
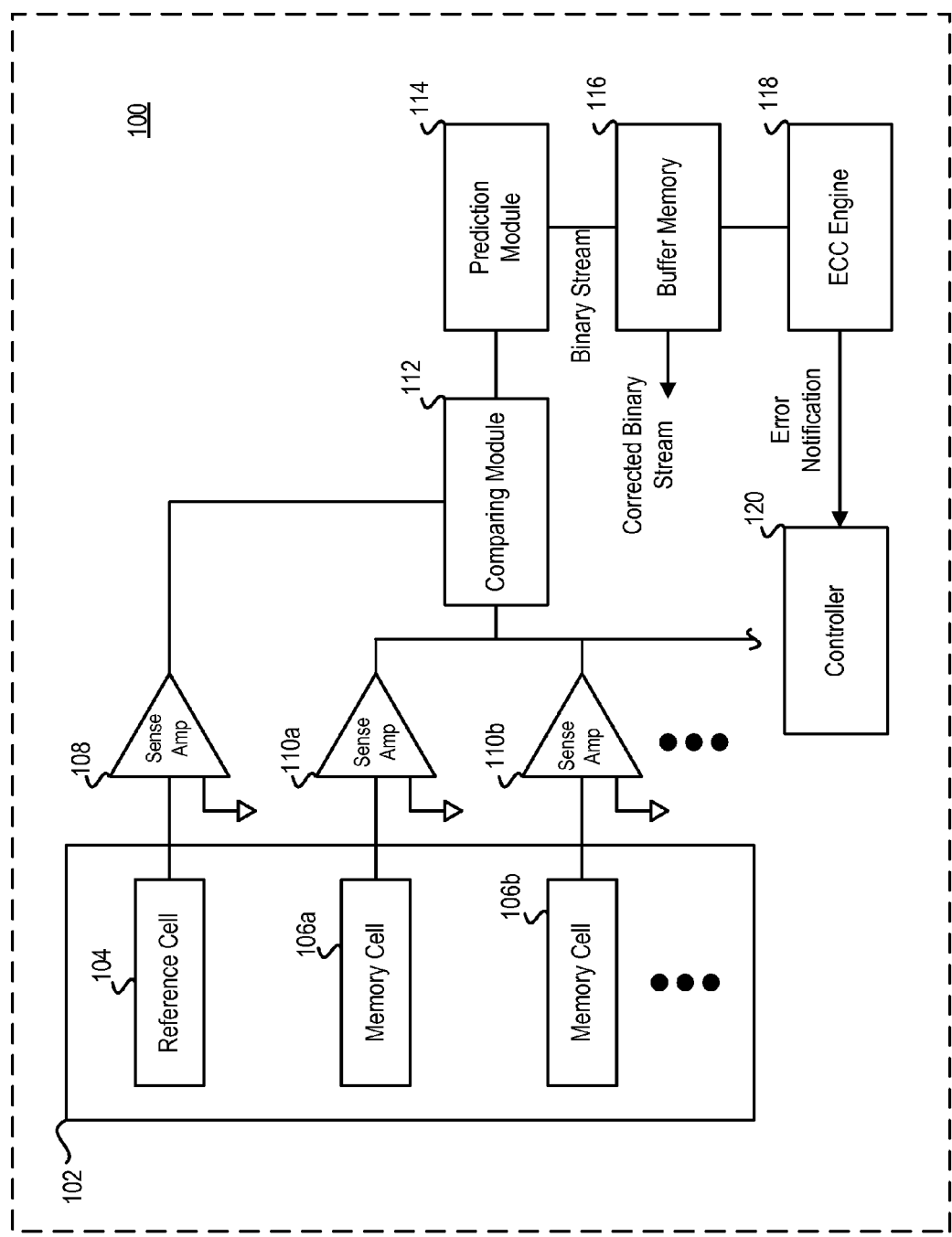
FIG. 1A is a block diagram illustrating an example system for partial voltage reads of memory cells.

Solid state memory devices typically include one or more memory chips that may be mounted on a card. A memory chip often includes a memory cell array and peripheral circuits, such as decoders and erase, write and read circuits. Some solid state memory devices also come with a controller that performs intelligent and higher level memory operations and interfacing. Solid-state memory devices can include memory cells having one or more charge storage elements. Examples of solid state memory devices include, but are not limited to non-volatile semiconductor memories, such as electrically erasable programmable read-only memory (EEPROM) and flash EEPROM.

In a conventional two-state memory device (e.g., EEPROM), the state of an individual memory cell in a memory cell array can be determined using a reference current level or reference voltage level. For example, a memory cell voltage level can be compared to an absolute value or to a value obtained from a reference cell in the memory array whose threshold has been set to a mid value between two states. If the voltage or current read from the memory cell is higher than a reference level (e.g., a reference cell voltage), the memory cell can be determined to be in a first state (e.g., a "zero" state). If the voltage or current read is less than that of the reference level, the memory cell 106 can be determined to be in a second state (e.g., a "one" state). Thus a two-state memory cell can store one bit of digital information. Multi-level memory cells can have more than two states. For example, a memory cell in a four-state memory device can have one of four possible states which can be represented by digital values (e.g., digital values 00, 01, 10, 11). Multi-level memory cells use multiple reference levels for determining the state of a memory cell.

Some memory cells can be externally programmed to generate a desired voltage. For example, a two-state EPROM can be programmed to a given state by applying successive programming voltage pulses to memory cells, each time adding incremental charge to the memory cells (e.g., adding incremental charges to floating gates of the memory cells). In between pulses, the memory cells can be read back or verified to determine memory cell voltages relative to a reference voltage level. The programming stops when a current state of a given memory cell has been verified to reach a desired state.

The memory cell array can be accessible by read/write circuits through a row decoder and a column decoder (not shown). In some solid state devices, a memory transistor of each memory cell in a memory array can be addressable through a set of selected word line(s) and bit line(s). For example, the row decoder selects one or more word lines and the column decoder selects one or more bit lines to apply appropriate voltages to the respective gates of the addressed memory cell (e.g., a memory transistor). Read/write circuits can be provided to read or write (program) the memory states of addressed memory cells. The read/write circuits can include a number of read/write modules connectable by bit lines to memory cells in the memory cell array.

In some devices during read or verify operations a sense amplifier determines current flowing through a drain of an addressed memory transistor connected through a selected bit line. The current depends on the charge stored in the memory transistor and its control gate voltage. For example, in a multi-state EEPROM cell, the floating gate of a memory transistor can be charged to one of several different levels. The level detected by the sense amplifier can be converted by level-to-bits conversion logic to a set of data bits to be stored in a data latch or buffer memory.

System for Partial Voltage Read of Solid State Memory

FIG. 1A is a block diagram illustrating an example system 100 for partial voltage reads of memory cells. In some implementations, the system 100 includes a memory cell array 102, sense amplifiers 108, 110, comparing module 112, prediction module 114, buffer memory 116, error correction code (ECC) engine 118 and controller 120. The memory cell array 100 further includes a reference cell 104 and memory cells 106.

The memory cell array 100 can be a two-dimensional array of memory cells arranged in rows and columns and addressable by word lines and bit lines. The array 100 can be formed using a NOR or NAND architecture. The system 100 can be a flash memory subsystem of a device (e.g., a media player, mobile phone) or a stand-alone memory system, such as a compact flash disk (e.g., SD card) or a flash drive (e.g., USB drive). A single reference cell 104 and two memory cells 106a and 106b are shown for clarity. It should be apparent, however, that a memory cell array can have large number of memory cells and reference cells with corresponding circuitry (e.g., sense amplifiers, decoding logic) for reading and writing data to the memory cells.

Figure 2:
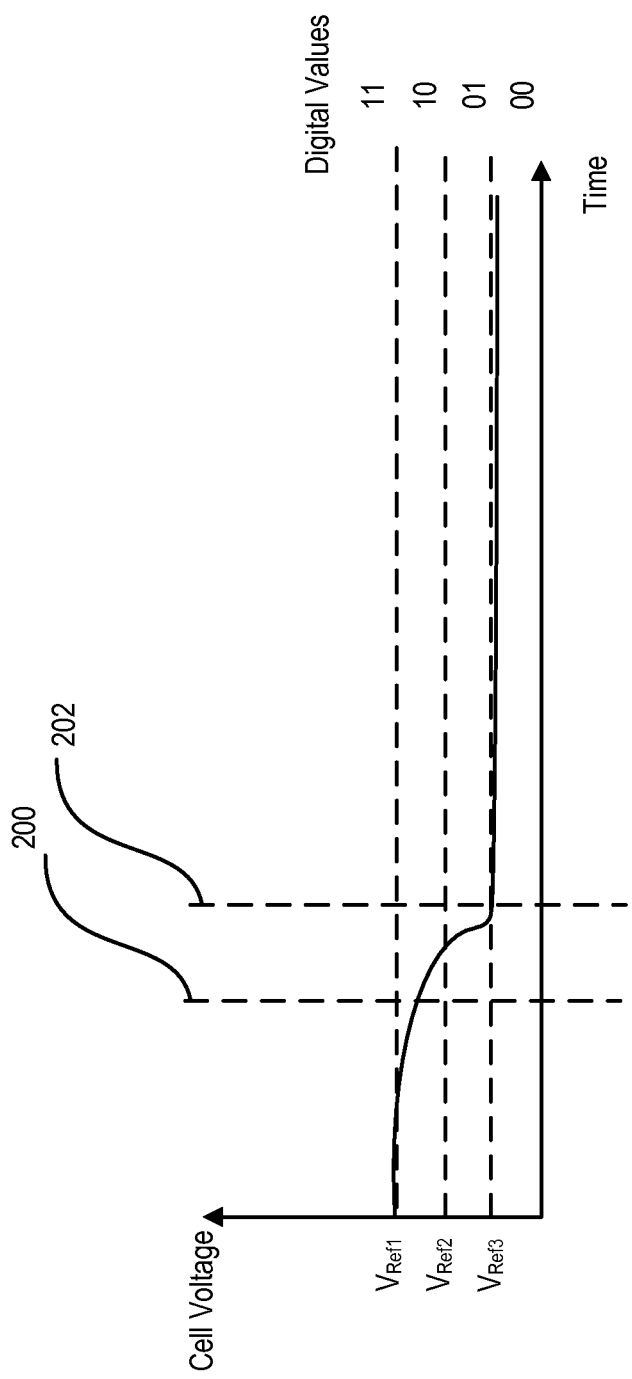
FIG. 2 is a graph illustrating a partial voltage read of a memory cell.

In some implementations, the system 100 makes partial reads of memory cell voltage levels on the downslope of voltage settling time to provide faster reading of memory. FIG. 2 is a graph illustrating a partial voltage read of a four-state memory cell. In the example shown, a partial voltage read is taken at time 200 when the cell voltage is settling to a steady state level at time 202. In the example shown, the cell voltage has substantially settled at a reference voltage level VRef3, which corresponds to digital value of "01."

Referring to FIGS. 1 and 2, the reference cell 104 and memory cells 106a, 106n will have substantially the same voltage settling times since both the reference cell 104 and memory cells 106 are part of the same memory cell array 102. At the time 200, a partial voltage read of reference cell 104 using sense amplifier 108 is made and compared with partial voltage reads of memory cells 106a, 106b made using sense amplifiers 110a, 110b. The partial voltage reads from the reference cell 104 and memory cells 106a, 106b are compared by comparing module 112 (e.g., an analog comparator circuit). The comparison of the reference cell 104 with memory cells 106a, 106b can be done sequentially and/or in parallel.

The result of the comparison (e.g., a difference voltage) is provided as input to the prediction module 114. In some implementations, the prediction module 114 can be a Partial Response (PR) Maximum Likelihood (ML) detector which is a known detection scheme used in modern disk drives. Other detection schemes are also possible such as peak detection schemes. The PRML detector can include a variable gain amplifier (VGA) for amplifying the analog signal output of the comparing module 112 to a certain and constant level of amplification. To keep the signal level, the VGA can receive a control signal from a clock and gain recovery system. The output signal of the VGA can be shaped by an equalizer. The output of the equalizer can be sampled by an analog-to-digital converter (ADC). The output of the ADC is stream of digital samples. In some implementations, the digital samples can be filtered by an additional digital filter to improve the quality of the analog equalization. The digital samples are used to detect the presence of transitions in the analog signal from the comparing module 112. If signal quality is good, a simple threshold detector can be used to distinguish between zero signal and transition by comparing the digital samples to a threshold. However, better detection may be achieved using an ML detector.

The binary stream output by the prediction module 114 (hereinafter "data") is input to the buffer memory 116 where it can be corrected prior to being released for host access (e.g., for use by a host processor in a computer, media player, etc.).

Before releasing the data for host access, the data can be checked for errors by the ECC engine 118, and if errors are detected, error correction can be attempted by the ECC engine 118 using an error correction scheme (e.g., Reed-Solomon code, turbo code, BCH code, binary Golay code, a binary Goppa code). If the errors in the data can be corrected using the error correction scheme, the bad data is corrected in the buffer memory 116 and released for host access. If the errors are not corrected using the error correction scheme, an error notification can be issued by the ECC engine 118 which can be used by the controller 120 to initiate full voltage reads of memory cells at time 202 (FIG. 2). The full voltage reads can be used to generate digital values using the methods previously described for partial voltage reads.

A primary advantage of the system 100 is that data can be read from memory cells faster by reading partial cell voltages before the voltages settle to their respective steady state voltage levels. Over many memory reads, the savings in read time can be significant for solid state memory devices that use partial voltage reads.

Figure 1B:
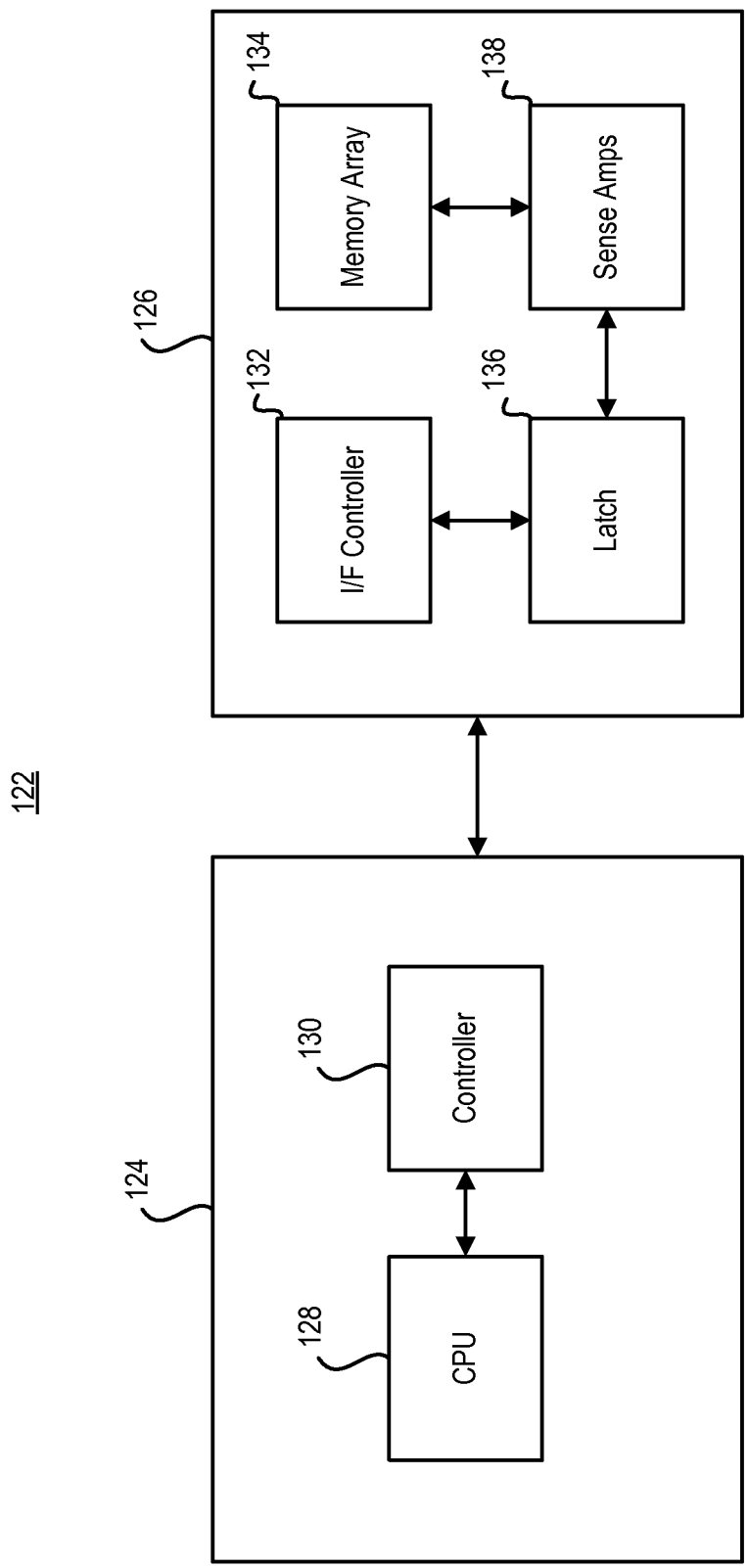
FIG. 1B is a block diagram illustrating another example system for partial voltage reads of memory cells.

FIG. 1B is a block diagram illustrating another example system 122 for partial voltage reads of memory cells. In some implementations, system 122 can include system on chip (SoC) 124 coupled to memory device 126 (e.g., NAND) over interface 140 (e.g., high-speed digital interface). The SoC 124 can include processor 128 and memory controller 130. The memory device 126 can include interface controller 132, memory cell array 134, latches 136 and sense amps 138.

In some implementations, sense amps 138 sense voltages on memory cells in memory cell array 134 and store the sensed voltages in latches 136. The controllers 130, 132 interoperate to allow the latches to be sampled over the digital interface 140. The latches 136 can be transparent or keep cycling. With the high-speed digital interface 140, a number of partial voltage reads can be made per x microseconds (e.g., 50 microseconds) which is about the time needed for the memory array 134 to stabilize.

Process Example

Figure 3:
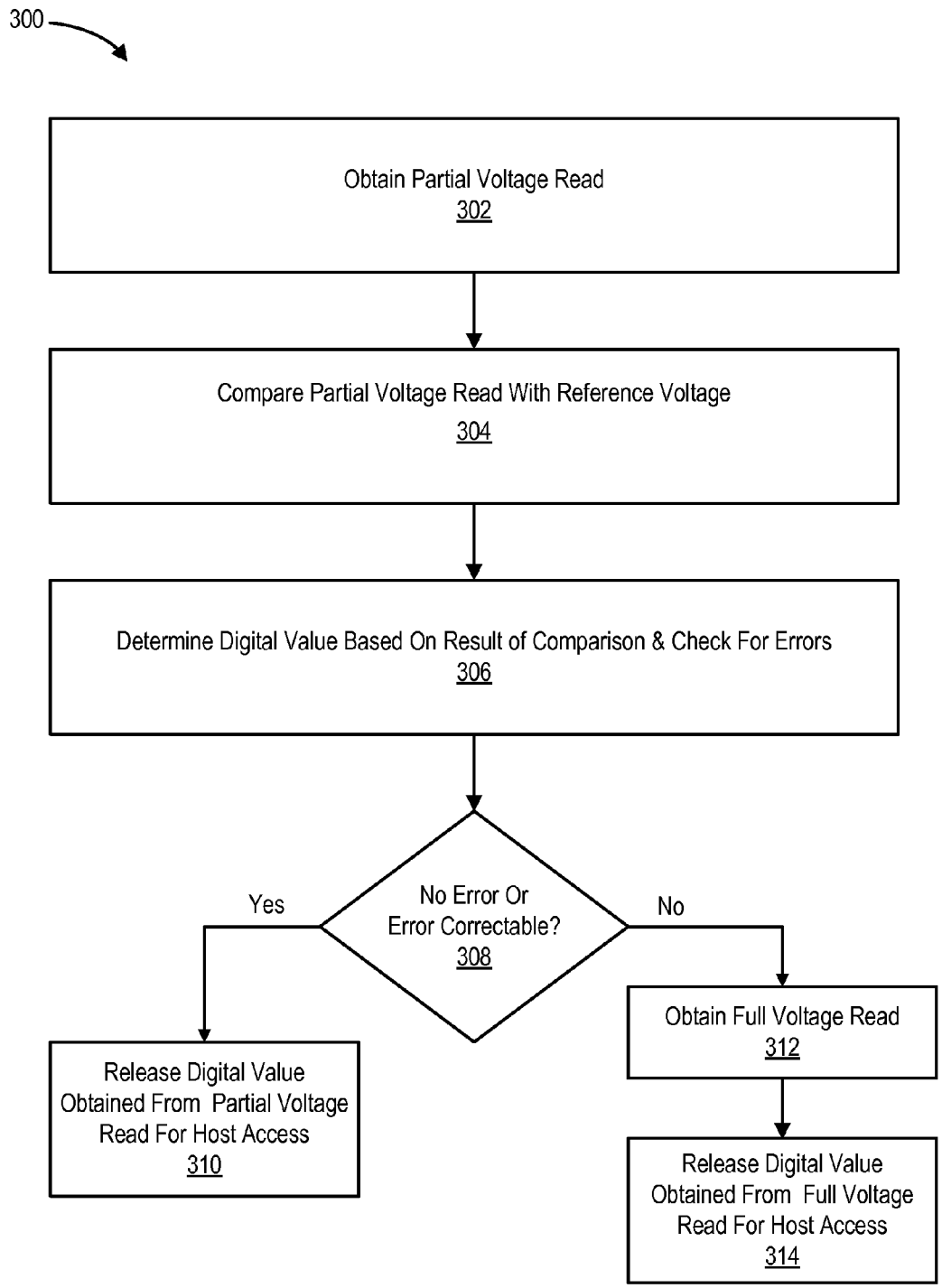
FIG. 3 is a flow diagram of an example process of a partial voltage read of a memory cell.

FIG. 3 is a flow diagram of an example process 300 of a partial voltage read of a memory cell. In some implementations, the process 300 begins by obtaining a partial cell voltage read (302). The partial voltage read is made at a first time prior to the cell voltage settling to a steady state voltage level. In some implementations, more than one partial voltage read can be made. The partial voltage read can be made at any time before the cell voltage settles. The partial voltage read can be made using a sense amplifier, for example. In some implementations, the memory cell read process can be initiated by a controller coupled to decoding logic and/or read circuitry.

The partial voltage read can be compared to a reference cell voltage (304). The comparing can include determining a difference between the partial voltage read of a memory cell and a reference cell voltage. A digital value can be determined based on the result of the comparison (306). In some embodiments, the output of a comparator can be input to PRML detector which can generate a stream of digital values or data. A digital value can be stored in a buffer memory where an ECC engine can detect and correct errors in the digital value. If there is no error or the error can be corrected to a specified precision (308), the state of the memory cell is known and the digital value obtained from the partial voltage read can be released for host access (310). A specified precision can be for example the ability to correct n bits (e.g., 1-bit error correction) in a data value. In some implementations, the precision can be specified by the user.

If there is an error that cannot be corrected to a specified precision (308), then the state of the memory cell is unknown and the error correction engine can issue an error notification. The issue notification can be used (e.g., by a controller) to initiate a substantially full voltage read on the memory cell at a second time occurring after the memory cell voltage has substantially settled to a steady state voltage level (312). The digital value obtained from the full voltage read can be released for host access (314).

Although the disclosed implementations are directed to reference voltages and memory cell voltage reads, it should be apparent that other implementations could use reference currents and memory cell currents.

A number of implementations have been described. Nevertheless, it will be understood that various modifications may be made. For example, elements of one or more implementations may be combined, deleted, modified, or supplemented to form further implementations. As yet another example, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A method comprising:
obtaining a first voltage read of a memory cell associated with a solid state memory device, the first voltage read representing a partial voltage level compared to a steady state voltage;
detecting an error resulting from the first voltage read;
if the error is correctable to a specified precision,
using the first voltage read to determine a state of the memory cell;
if the error is not correctable to the specified precision,
obtaining a second voltage read of the memory cell at a time after the first voltage read is obtained, the second voltage read representing the steady state voltage; and
using the second voltage read to determine the state of the memory cell;
obtaining a digital value from the first voltage read;
detecting an error in the digital value;
if an error is detected,
determining if the error can be corrected;
if the error can be corrected,
correcting the error; and
if the error cannot be corrected,
initiating the second voltage read;
wherein the error is corrected using a code from a group of error correcting codes including: Reed-Solomon code, BCR code, turbo code, Golay binary code, Goppa binary code.

2. The method of claim 1, wherein the first voltage read is a partial voltage read and the second voltage read is a substantially full voltage read.

3. The method of claim 1, wherein the first voltage read is made while the memory cell voltage is settling and the second voltage read is made after the memory cell voltage has substantially settled.

4. The method of claim 2, further comprising: releasing the digital value for host access if the error is corrected.

5. A method comprising:
reading a first level from a memory cell associated with a solid state memory device, the first level representing a partial level compared to a steady state;
comparing the first level to a reference level;
generating a first digital value that is indicative of the first level based on a result of the comparing;
detecting an error in the first digital value;
determining if the error is correctable;
if the error is not correctable,
reading a second level from the memory cell, the second level representing the steady state;
comparing the second level to the reference level; and
generating a second digital value that is indicative of the second level based on a result of the comparing;
wherein generating a first digital value further comprises applying a Partial Response (PR) Maximum Likelihood (ML) detector to the results of the comparing.

6. The method of claim 5, wherein the reading the first level further comprises:
reading a partial voltage from the memory cell at a time prior to reading the second level.

7. The method of claim 5, wherein reading the second level further comprises:
reading a substantially full voltage from the memory cell after the memory cell voltage has substantially settled.

8. The method of claim 6, wherein the reference level is a reference cell voltage associated with the solid state memory device.

9. A system comprising:
a memory cell array including a memory cell associated with a solid state memory device; and
a controller coupled to the memory cell array and operable to:
obtain a first voltage read of the memory cell, the first voltage read representing a partial voltage level compared to a steady state voltage;
detecting an error from the first voltage read;
determining if the error is correctable to a specified precision; and
if the error is not correctable to the specified precision, obtaining a second voltage read of the memory cell at a time after the first voltage read is obtained, the second voltage read representing the steady state voltage;
wherein the controller is operable for performing operations comprising:
obtaining a digital value from the first voltage read;
detecting an error in the digital value; and
if the error cannot be corrected, initiating the second voltage read of the memory cell;
wherein the error is corrected using a code from a group of error correcting codes including: Reed-Solomon error correction code, BCR code, turbo code, Golay binary code and Goppa binary code.

10. The system of claim 9, wherein the first voltage read is a partial voltage read and the second voltage read is a substantially full voltage read.

11. The system of claim 9, wherein the first voltage read is made while the memory cell voltage is settling and the second voltage read is made after the memory cell voltage has substantially settled.

12. The system of claim 10, where the controller performs operations comprising: releasing the digital value for host access if the error is corrected.

13. A system comprising:
a memory cell array including a memory cell associated with a solid state memory device;
a sense amplifier operable for reading a first level from a memory cell, the first level representing a partial level compared to a steady state;
a comparator operable for comparing the first level to a reference level;
a prediction module operable for generating a first digital value based on a result of the comparing, the first digital value indicative of the first level;

an error correction engine operable for detecting an error in the first digital value, for determining if the error is correctable, and for issuing an error notification if the error is not correctable; and a controller operable for receiving the error notification and for initiating a reading of a second level from the memory cell in response to the error notification, the second level representing the steady state;

wherein the prediction module is a Partial Response (PR) Maximum Likelihood (ML) detector.

14. The system of claim 13, wherein the first level is a partial voltage read from the memory cell at a time prior to reading the second level.

15. The system of claim 13, wherein the second level is a substantially full voltage read from the memory cell after the memory cell voltage has substantially settled.

16. The system of claim 14, wherein the reference level is a reference cell voltage associated with the solid state memory device.

* * * * *